US008855157B2

(12) United States Patent
Higuchi

(10) Patent No.: US 8,855,157 B2
(45) Date of Patent: Oct. 7, 2014

(54) SURFACE EMITTING LASER ELEMENT

(75) Inventor: Yu Higuchi, Anan (JP)

(73) Assignee: Nichia Corporation, Anan-shi (JP)

( * ) Notice: Subject to any disclaimer, the term of this patent is extended or adjusted under 35 U.S.C. 154(b) by 78 days.

(21) Appl. No.: 13/413,375

(22) Filed: Mar. 6, 2012

(65) Prior Publication Data

US 2012/0230360 A1    Sep. 13, 2012

(30) Foreign Application Priority Data

Mar. 9, 2011    (JP) .................................. 2011-050939

(51) Int. Cl.
| | |
|---|---|
| *H01S 5/00* | (2006.01) |
| *B82Y 20/00* | (2011.01) |
| *H01S 5/042* | (2006.01) |
| *H01S 5/183* | (2006.01) |
| *H01S 5/343* | (2006.01) |

(52) U.S. Cl.
CPC ............ *H01S 5/18341* (2013.01); *H01S 5/0425* (2013.01); *H01S 5/18325* (2013.01); *B82Y 20/00* (2013.01); *H01S 5/34333* (2013.01); *H01S 5/18327* (2013.01)
USPC ........................................................ 372/45.01

(58) Field of Classification Search
USPC ................................................ 372/45, 45.01
See application file for complete search history.

(56) References Cited

U.S. PATENT DOCUMENTS

| | | | | | |
|---|---|---|---|---|---|
| 4,943,970 | A | * | 7/1990 | Bradley ...................... | 372/45.01 |
| 5,068,869 | A | * | 11/1991 | Wang et al. ................ | 372/45.01 |
| 5,070,509 | A | * | 12/1991 | Meyers ....................... | 372/45.01 |
| 5,331,658 | A | * | 7/1994 | Shieh et al. ............... | 372/50.124 |
| 5,773,319 | A | * | 6/1998 | Chu et al. .................... | 438/39 |
| 6,760,357 | B1 | * | 7/2004 | Boucart et al. ................. | 372/96 |
| 7,020,173 | B2 | * | 3/2006 | Yamamoto et al. ......... | 372/45.01 |
| 7,030,407 | B2 | * | 4/2006 | Michler ......................... | 257/13 |
| 7,099,363 | B2 | * | 8/2006 | Otsubo ....................... | 372/46.01 |
| 7,573,074 | B2 | * | 8/2009 | Shum et al. ...................... | 257/99 |
| 7,577,176 | B2 | * | 8/2009 | Shimizu et al. ........... | 372/45.011 |
| 7,778,297 | B2 | * | 8/2010 | Kageyama et al. ......... | 372/43.01 |

(Continued)

FOREIGN PATENT DOCUMENTS

JP    2010-123921    6/2010

OTHER PUBLICATIONS

P. Mackowiak and W. Nakwaki, Some Aspects of Designing an Efficient Nitride CVSEL Resonator, 2001 IOP Publishing Ltd, Print in the UK, 2001, Journal of Physics and Applied Physics, vol. 34, p. 954.*

(Continued)

*Primary Examiner* — Xinning Niu
*Assistant Examiner* — Vu A Vu
(74) *Attorney, Agent, or Firm* — Foley & Lardner LLP

(57) ABSTRACT

Disclosed is a surface emitting laser element capable of reducing threshold current. A surface emitting laser element according to an embodiment includes a semiconductor portion having a first semiconductor layer and a second semiconductor layer, a first reflector disposed at the first semiconductor layer side of the semiconductor portion, and a second reflector disposed at the second semiconductor layer side of the semiconductor portion. Particularly includes a second electrode disposed between the second semiconductor layer and the second reflector and connected to the second semiconductor layer, a connecting electrode disposed laterally around the second reflector and connected to the second electrode, and a current confinement portion disposed between the second semiconductor layer and the connecting electrode and capable of reflecting light from the semiconductor portion.

14 Claims, 4 Drawing Sheets

(56) References Cited

U.S. PATENT DOCUMENTS

| | | | |
|---|---|---|---|
| 7,881,353 B2* | 2/2011 | Kageyama et al. | 372/46.01 |
| 7,986,722 B2* | 7/2011 | Higuchi et al. | 372/50.124 |
| 2006/0002444 A1* | 1/2006 | Wang et al. | 372/50.1 |
| 2006/0285566 A1* | 12/2006 | Ueki | 372/45.01 |
| 2007/0091965 A1* | 4/2007 | Tanabe et al. | 372/50.124 |
| 2007/0201527 A1* | 8/2007 | Hori et al. | 372/50.124 |
| 2010/0098127 A1* | 4/2010 | Higuchi et al. | 372/50.11 |
| 2010/0246625 A1* | 9/2010 | Kawashima et al. | 372/45.01 |

OTHER PUBLICATIONS

Higuchi, Y. et al. "Room-Temperature CW Lasing of a GaN-Based Vertical-Cavity Surface-Emitting Laser by Current Injection", Applied Physics Express, 2008, vol. 1, pp. 121102-1 to 121102-3.

Kasahara, D. et al. "Demonstration of Blue and Green GaN-Based Vertical-Cavity Surface-Emitting Lasers by Current Injection at Room Temperature", Applied Physics Express, 2011, vol. 4, pp. 072103-1 to 072103-3.

Omae, K. et al. "Improvement in Lasing characteristics of GaN-based Vertical-Cavity Surface-Emitting Lasers Fabricated Using a GaN Substrate", Applied Physics Express, 2009, vol. 2, pp. 052101-1 to 052101-3.

\* cited by examiner

SURFACE EMITTING LASER ELEMENT

CROSS-REFERENCE TO RELATED APPLICATION

The present application claims priority under 35 U.S.C. §119 to Japanese Patent Application No. 2011-50939 tiled on Mar. 9, 2011, the content of which is hereby incorporated by reference in its entirety.

BACKGROUND OF THE INVENTION

1. Technical Field

The present invention relates to a surface emitting laser element. 2. Description of the Related Art As a type of semiconductor laser element, a surface emitting laser element has been presented, for example, in JP 2010-123921A. The surface emitting laser element shown in FIG. 1 of JP 2010-123921A includes a semiconductor portion, a second Bragg reflector 18 (corresponding to a first reflector of the present invention) disposed at one side of the semiconductor portion, a first Bragg reflector 12 (corresponding to a second reflector of the present invention) disposed at the other side of the semiconductor portion, a first transparent electrode 13 (corresponding to a second electrode of the present invention) disposed on a main surface of the other side of the semiconductor portion, an insulating layer 22 (corresponding to a current confinement portion of the present invention) disposed at a peripheral portion of the first transparent electrode 13, and a connecting electrode 23 (corresponding to a connecting electrode 50 of the present invention) disposed over the insulating layer 22 and connected to the first transparent electrode 13.

RELATED ART REFERENCE

Patent Reference

Patent reference 1: JP 2010-123921A

In the conventional surface emitting laser element, optical loss in the connecting electrode 23 is not considered.

SUMMARY OF THE INVENTION

The present invention is devised to solve the problems as described above, and is aimed to provide a surface emitting laser element capable of reducing threshold current.

A surface emitting laser element according to the present embodiment includes a semiconductor portion having a first semiconductor layer and a second semiconductor layer, a first reflector disposed at the first semiconductor layer side of the semiconductor portion, and a second reflector disposed at the second semiconductor layer side of the semiconductor portion. Particularly, the surface emitting laser element according to the present embodiment includes a second electrode disposed between the second semiconductor layer and the second reflector and connected to the second semiconductor layer, a connecting electrode disposed laterally around the second reflector and connected to the second electrode, and a current confinement portion disposed between the second semiconductor layer and the connecting electrode and capable of reflecting light from the semiconductor portion.

DETAILED DESCRIPTION OF PREFERRED EMBODIMENTS

Figure 1:
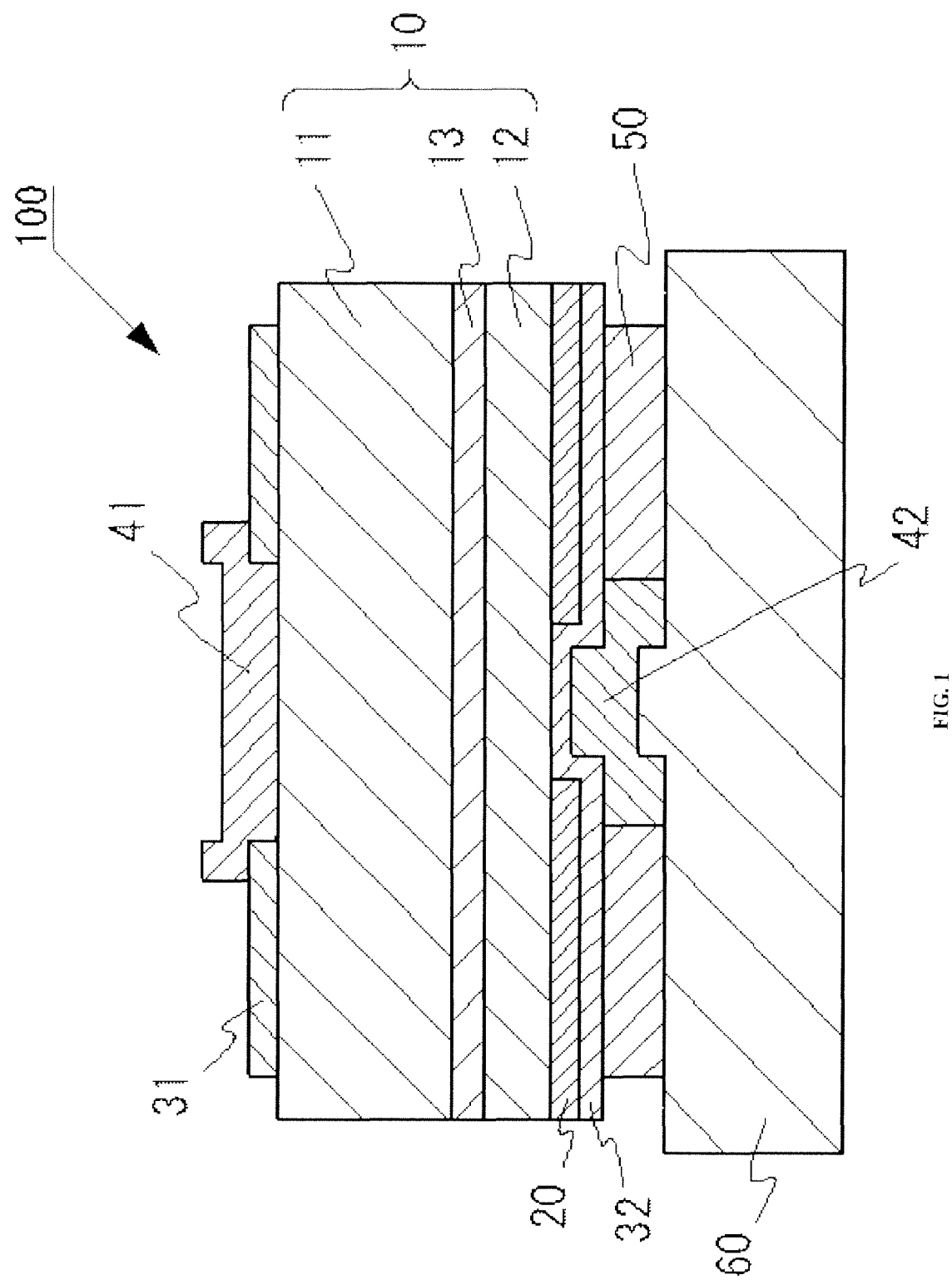
FIG. 1 is a cross-sectional view for illustrating a surface emitting laser element according to Embodiment 1.

Preferred embodiments of the present invention will be described below with reference to the accompanying drawings. The embodiments described below are intended to exemplify the technical spirit of the present invention, and the scope of the invention is not limited to these unless specifically stated. Further, in the description below, the same designations or the same reference numerals denote the same or like members and duplicative descriptions will be appropriately omitted.

Embodiment 1

FIG. 1 shows a cross-sectional view in a stacked layer direction of the semiconductor in a surface emitting laser element according to the present embodiment. The surface emitting laser element 100 according to the present embodiment includes a semiconductor portion 10 having a first semiconductor layer 11 and a second semiconductor layer 12, a first reflector 41 disposed at the first semiconductor layer 11 side of the semiconductor portion 10, and a second reflector 42 disposed at the second semiconductor layer 12 side of the semiconductor portion 10. Particularly, the embodiment includes a second electrode 32 disposed between the second semiconductor layer 12 and the second reflector 42 and connected to the second semiconductor layer 12, a connecting electrode 50 disposed laterally around the second reflector 42 and connected to the second electrode 32, and a current confinement portion 20 disposed between the second semiconductor layer 12 and the connecting electrode 50 and capable of reflecting light from the semiconductor portion 10.

With the current confinement portion 20 capable of reflecting light from the semiconductor portion 10 being disposed between the second semiconductor layer 12 and the connecting electrode 50, optical absorption in the connecting electrode 50 can be prevented. That is, providing a current confinement portion 20 capable of reflecting light enables prevention of optical loss in the connecting electrode 50. Accordingly, reduction of the threshold current and improvement of the optical output can be expected.

The main components of the surface emitting laser element of the present embodiment will be described below.

(Semiconductor Portion 10)

The structure of the semiconductor portion 10 is not specifically limited as long as the semiconductor portion 10 has at least the first semiconductor layer 11 and the second semiconductor layer 12. The first semiconductor layer 11 is a member for connecting the first electrode 31 and has a polarity different than that of the second semiconductor layer 12. In approximately the same manner, the second semiconductor layer 12 is a member for connecting the second electrode 32 and has a polarity different than that of the first semiconductor layer 11. In the present embodiment, the first semiconductor layer 11 is an n-type, the second semiconductor layer 12 is a p-type, and an active layer 13 is interposed between them to form the semiconductor portion. The structure of the active layer 13 is not particularly limited, and a known structure such as a multi quantum well structure or a single quantum well structure can be employed. The material of each constituting layer of the semiconductor portion 10 is not limited, but in the present embodiment, a nitride semiconductor represented for example by a general formula of $In_xAl_yGa_{1-x-y}N$ ($0 \leq x \leq 1$, $0 \leq y \leq 1$, and $0 \leq x+y \leq 1$) is used.

(Current Confinement Portion 20)

The current confinement portion 20 is disposed for confining electric current in a desired region (current confinement region), in order to reflect light from the semiconductor portion 10. The structure of the current confinement portion 20 is not particularly limited, but in the present embodiment, the current confinement portion 20 is a distributed Bragg reflector ("DBR") comprising a dielectric multilayer. Examples of each constituent layer of the dielectric multilayer include $SiO_2$, $TiO_2$, $Nb_2O_5$, $ZrO_2$, $Ta_2O_5$, $HfO_2$, AlN, SiN, $Al_2O_3$, SiC, and MgO. Of those dielectric bodies, two or more material layers having different refractive indices are alternately stacked to obtain the current confinement portion 20 made of a dielectric multilayer capable of reflecting light from the semiconductor portion 10. For example, a multilayer such as $SiO_2/Nb_2O_5$, $SiO_2/ZrO_2$, and $SiO_2$/AlN is preferable. The thickness of the current confinement portion 20 may be 0.03 μm or more, and less than 7.0 μm, preferably 0.04 μm or more, and less than 5.0 μm, and more preferably 0.05 μm or more, and less than 3.0 μm. It is preferable that the thickness is appropriately adjusted according to the thermal conductivity and reflectance of the entire current confinement portion which are dependent on the materials being used.

A material having a refractive index smaller than that of the semiconductor portion 10 and/or the second electrode 31 is suitable for the current confinement portion 20. With such a refractive index, lateral confinement of light can be securely achieved.

The current confinement portion 20 is preferably adjusted to match the phase of the standing wave in the current confinement region. This is because, with this arrangement, optical loss in the current confinement portion 20 can be sufficiently decreased. Also, on the current confinement portion 20, the region where the second reflector 42 is formed and the region where the connecting electrode 50 is formed may have different layer structures. Accordingly, optical loss can be further decreased.

(First Electrode 31)

In the present embodiment, the first electrode 31 is formed as an n-electrode. The first electrode 31 as the n-electrode may contain one of Pd, Pt, Ni, Au, Ti, W, Cu, Ag, Zn, Sn, In, Al, Ir, Rh, V, ITO and the like.

Figure 2:
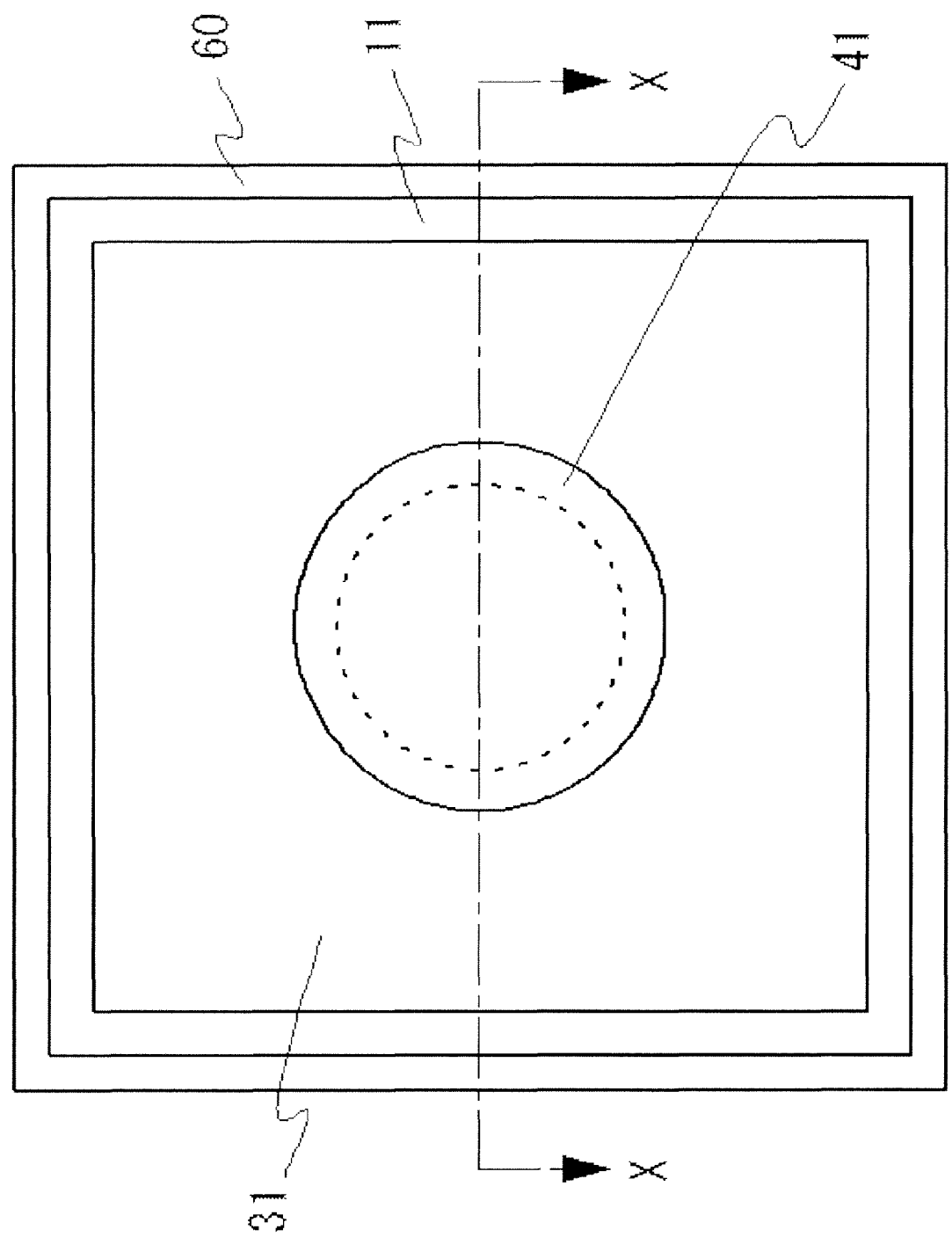
FIG. 2 is a plan view of a surface emitting laser element according to Embodiment 1.

FIG. 2 shows a plan view of a surface emitting laser element 100 seen from the first reflector 41 side. The first electrode 31 has an opening (portion shown in dotted line in FIG. 2) where the first semiconductor layer 11 is exposed, and the first semiconductor layer 11 and the first reflector 41 are in contact with each other at the opening where the first semiconductor layer 11 is exposed. The outer edge of the first electrode 31 is arranged near the outer edge of the first semiconductor layer 11.

(Second Electrode 32)

In the present embodiment, the second electrode 32 is formed as a p-electrode. For the second electrode 32 which is the p-electrode, preferably ZnO, $In_2O_3$, $SnO_2$, ATO, ITO, MgO, or Ni/Au, more preferably ITO can be used. The thickness thereof is not specifically limited, and about 5 to 100 nm can be used. In the present embodiment, light from the active layer 13 is needed to propagate through the second electrode 32 and to be reflected at the second reflector 42, and for this reason, the second electrode 32 is substantially transparent with respect to the light from the active layer 13.

The second electrode 32 is directly connected to the second semiconductor layer 12 in the opening of the current confinement portion 20 and is further extended between the current confinement portion 20 and the connecting electrode 50.

(Connecting Electrode 50)

The connecting electrode 50 is a member which is electrically connected to the second electrode 32 and is disposed laterally around the second reflector 42. In other words, the connecting electrode 50 has an opening and the second reflector 42 is arranged in the opening.

The connecting electrode 50 is required to have high electric conductivity and thermal conductivity, so that due to the relationship between the material and the thickness thereof, the connecting electrode 50 has low light transmissive property to the light from the semiconductor portion 10 compared to that of the second electrode 32, and more easily absorbs the light from the semiconductor portion 10 (for example, it is opaque). The connecting electrode 50 can be constituted with a material containing at least one of Ni, Au, Ag, Cu, Pt, Al, Pd, Rh, Ti, Mo, Cr and W. More specifically, Ti—Rh—Au, Cr—Pt—Au, Ni—Au, Ni—Au—Pt, Pd—Pt, Ni—Pt and the like can be exemplified.

In the case where the second reflector 42 is made of a dielectric multilayer, because the thermal conductivity of a dielectric material is generally lower than that of a semiconductor material, heat dissipation from the semiconductor portion 10 becomes a more significant concern. That is, the region for electric current flow is limited to the current confinement region in the semiconductor portion 10, so that the current confinement region is the main heat source. But in the case where the second reflector 42 made of a dielectric multilayer having low thermal conductivity is interposed between the current confinement region and the supporting substrate 60, a problem arises in which the heat releasing path is disrupted and resulting in impairment of heat dissipation. On the other hand, in order to improve heat dissipation, it is sufficient to dispose a connecting electrode 50 having excellent heat conductivity close to the current confinement region. But if the connecting electrode 50 is disposed too close to the current confinement region, a problem of optical absorption by the connecting electrode 50 arises. For this reason, a current confinement portion 20 capable of not only confining electric current but also reflecting light is interposed between the connecting electrode 50 and the second semiconductor layer 12, and thus enables to obtain a surface emitting laser element in which optical loss is reduced while heat dissipating property is improved.

It is preferable that the circumference of the opening of the current confinement portion 20 substantially matches the circumference of the opening of the connecting electrode 50, or more preferably, as shown in FIG. 1, it locates at an inner side of the circumference of the opening of the connecting electrode 50 (that is, the opening of the current confinement portion 20 is smaller than the opening of the connecting electrode 50). This is because reflecting light at the current confinement portion 20 enables further reduction of optical absorption by the connecting electrode 50.

In FIG. 1, the connecting electrode 50 is disposed only at a portion laterally around the second reflector 42 and not at a portion between the second reflector 42 and the supporting substrate 60. However, it is needless to say that the connecting electrode 50 may also be interposed between the second reflector 42 and the supporting substrate 60 as needed.

(First Reflector 41, Second Reflector 42)

The first reflector 41 and the second reflector 42 are made of a semiconductor multilayer or a dielectric multilayer. In the case where the first reflector 41 and the second reflector 42 are made of respective dielectric multilayer, examples of each constituent layer of the dielectric multilayer include $SiO_2$, TiO₂, ZrO₂, Ta₂O₅, HfO₂, AlN, SiN, Al₂O₃, SiC, and MgO. Of those dielectric bodies, alternately stacking two or more kinds of material layers having different refractive indices at a respective predetermined thickness enables obtaining of the first reflector 41 and the second reflector 42 each made of a dielectric multilayer. For example, a multilayer of SiO₂/Nb₂O₅, SiO₂/ZrO₂, SiO₂/AlN and the like is preferable. The thickness of the first reflector 41 and the second reflector 42 may be 0.3 μm or more, and less than 7.0 μm, preferably 0.4 μm or more, and less than 6.0 μm, and more preferably 0.5 μm or more, and less than 5.0 μm. The thickness thereof is preferably adjusted according to the thermal conductivity and reflectance of the entire first reflector 41 and the second reflector 42 which are determined by the materials used.

(Supporting Substrate 60)

The supporting substrate 60 is a member connected to the connecting electrode 50. Various kinds of materials can be employed for the supporting substrate 60, but Si, GaN, or AlN is preferred and Si is more preferred. In the figure, the supporting substrate 60 is shown as including a connecting layer which is made of a metal and the like and is for connecting to the supporting electrode 50.

The supporting substrate 60 is not necessarily a single layer and may be a multilayer. Further, a conductive supporting substrate is used in the present embodiment, but the supporting substrate 60 does not necessarily need to have electrical conductivity and may be electrically insulating. In the case where the supporting substrate 60 is electrically insulating, for example, an electrically conductive through-hole is provided in the supporting substrate and electric conduction with the contact electrode can be established through the through-hole.

A member having a high reflectance such as Al can also be contained in the supporting substrate 60 at the second reflector 42 side in the vicinity of the current confinement region. With this arrangement, the reflectance in the vicinity of current confinement region can be further improved.

Embodiment 2

Figure 3:
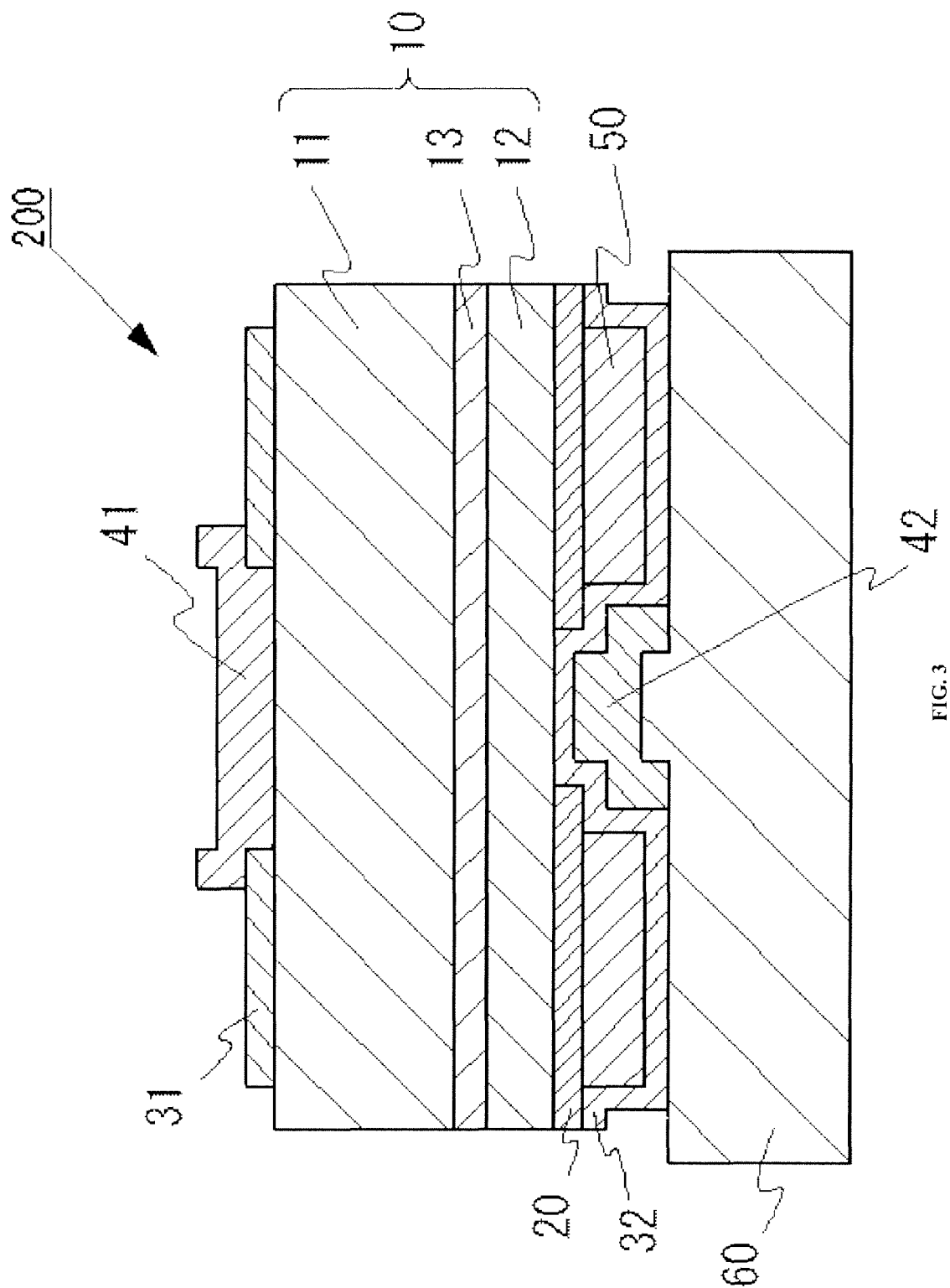
FIG. 3 is a cross-sectional view for illustrating a surface emitting laser element according to Embodiment 2.

FIG. 3 shows a cross-sectional view of the surface emitting laser element 200 according to the present embodiment. The surface emitting laser element 200 is substantially the same as in Embodiment 1 except for the second electrode 32 and the connecting electrode 50.

That is, in the surface emitting laser element 200, the connecting electrode 50 is directly in contact with the current confinement portion 20 without interposing second electrode 32 between them, and the supporting substrate 60 is directly in contact with the second electrode 32 without interposing connecting electrode 50 between them. Even with such a configuration, approximately the same level of effects as in Embodiment 1 can be expected.

Embodiment 3

Figure 4:
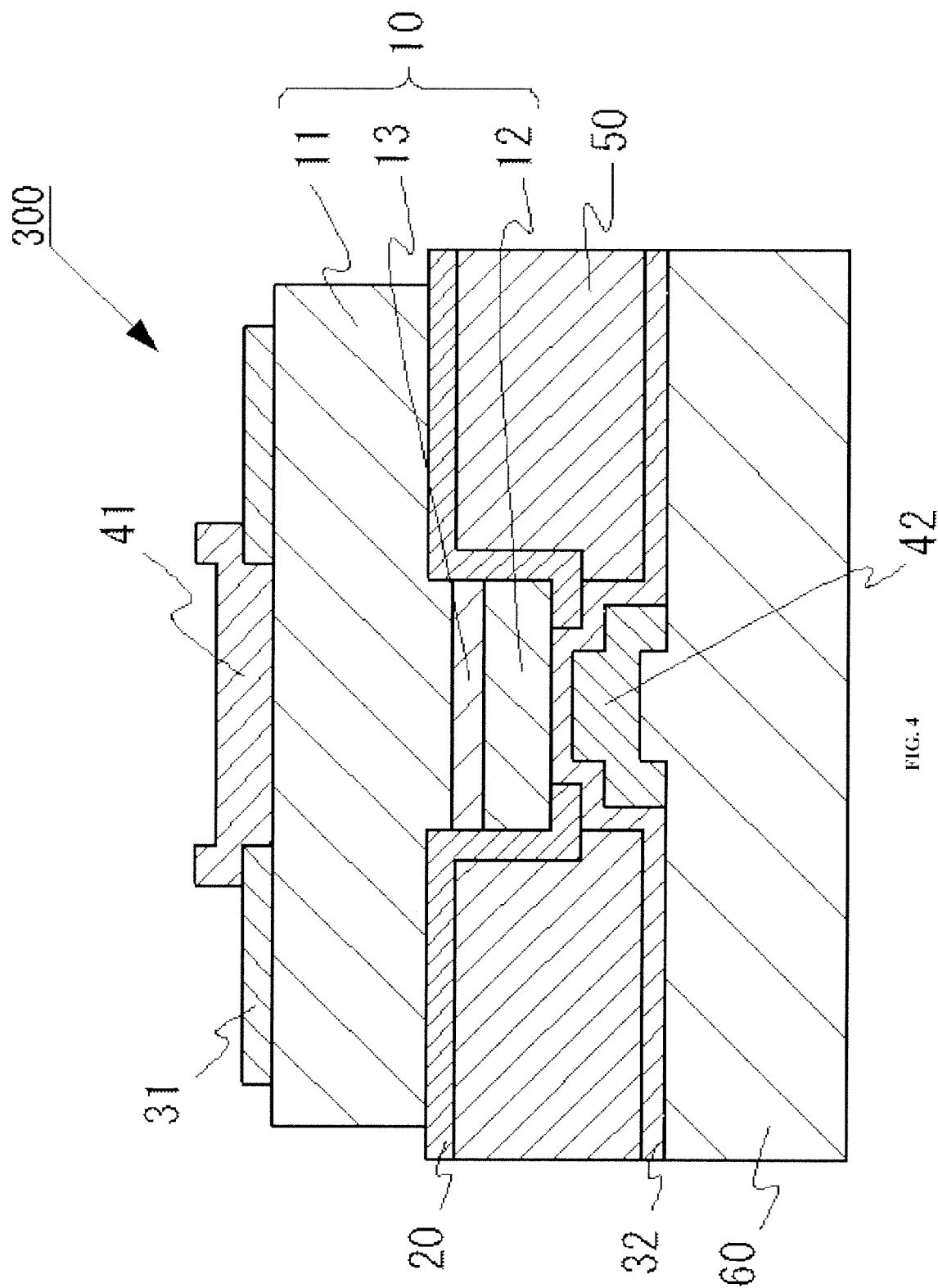
FIG. 4 is a cross-sectional view for illustrating a surface emitting laser element according to Embodiment 3.

FIG. 4 shows a cross-sectional view of the surface emitting laser element 300 according to the present embodiment. The main differences between the surface emitting laser element 300 and the surface laser emitting element 200 of Embodiment 2 are that, in the surface laser emitting element 300, the thickness of the semiconductor portion 10 around the current confinement region is smaller than that of the current confinement region, and accordingly, a protruding portion is formed, and that the current confinement portion 20 capable of reflecting light is disposed on the protruding portion not only at the side which is disposed with the second reflector 42 but also at the side surface (a plane in parallel with a straight line connecting the first reflector 41 and the second reflector 42).

In the surface emitting laser element 300, the current confinement portion 20 for reflecting light is formed on the side surface of the protruding portion which includes the active layer 13. With this configuration, strong confinement of light in a lateral direction can be expected.

In Embodiments 1 to 3, the first electrode 31 and the second electrode 32 are arranged at the opposite sides of the semiconductor portion 10, but the surface emitting laser element according to the present invention is not limited thereto. For example, it may be such that a part of the semiconductor portion 10 is removed from the second semiconductor layer 12 side to expose the first semiconductor layer 11, and the first electrode 31 is disposed on the removed portion.

Although the foregoing refers to particular preferred embodiments, it will he understood that the disclosure is not so limited. Various modifications may be made to the disclosed embodiments and that such modifications are intended to be within the scope of the disclosure. All of the publications, patent applications and patents cited herein are incorporated herein by reference in their entirety.

What s claimed is:

1. A surface emitting laser element comprising:
   a semiconductor portion having a first semiconductor layer and a second semiconductor layer;
   a first reflector disposed at the first semiconductor layer side of the semiconductor portion; and
   a second reflector disposed at the second semiconductor layer side of the semiconductor portion;
   a first electrode connected to the first semiconductor layer;
   a second electrode disposed between the second semiconductor layer and the second reflector, a portion of the second electrode being connected to the second semiconductor layer;
   a connecting electrode disposed laterally around the second reflector, the connecting electrode being connected to the second electrode; and
   a distributed Bragg reflector (DBR) comprising a dielectric multilayer, the DBR being disposed between the second semiconductor layer and the connecting electrode, the DBR being configured to reflect light from the semiconductor portion, and the DBR being disposed laterally around the portion of the second electrode that is connected to the second semiconductor layer.

2. The surface emitting laser element according to claim 1, wherein the first and second semiconductor layers are nitride semiconductors.

3. The surface emitting laser element according to claim 1, wherein the DBR has an opening, the connecting electrode has an opening, and the opening of the is smaller than the opening of the connecting electrode.

4. The surface emitting laser element according to claim 1, wherein a portion of the second electrode is disposed between the DBR and the connecting electrode.

5. The surface emitting laser element according to claim 1, wherein the dielectric multilayer of the DBR contains at least two selected from the group consisting of SiO₂, TiO₂, Nb₂O₅, ZrO₂, Ta₂O₅, HfO₂, AlN, SiN, Al₂O₃, SiC, and MgO.

6. The surface emitting laser element according to claim 1, wherein the dielectric multilayer of the DBR is made of SiO₂/Nb₂O₅, SiO₂/ZrO₂, or SiO₂/AlN.

7. The surface emitting laser element according to claim 1, wherein the thickness of the DBR is 0.03 μm or more and less than 7.0 μm.

8. The surface emitting laser element according to claim 1, wherein each of the first reflector and second reflector is made of SiO₂/Nb₂O₅, SiO₂/ZrO₂, or SiO₂/AlN.

9. The surface emitting laser element according to claim 1, wherein the DBR is made of a material having a refractive index smaller than the refractive index of at least one of the semiconductor portion and the second electrode.

10. The surface emitting laser element according to claim 1, wherein the semiconductor portion is made of a nitride semiconductor.

11. The surface emitting laser element according to claim 1, wherein the second electrode is made of ZnO, $In_2O_3$, $SnO_2$, ATO, ITO, MgO or Ni/Au.

12. A surface emitting laser element comprising:
a semiconductor portion having a first semiconductor layer and a second semiconductor layer;
a first reflector disposed at the first semiconductor layer side of the semiconductor portion; and
a second reflector disposed at the second semiconductor layer side of the semiconductor portion;
wherein the semiconductor portion comprises a protruding portion at the second semiconductor side of the semiconductor portion;
wherein a first electrode is connected to the first semiconductor layer;
wherein a second electrode is disposed between the protruding portion of the semiconductor portion and the second reflector, a portion of the second electrode being connected to the second semiconductor layer;
wherein a connecting electrode is disposed laterally around the second reflector and is connected to the second electrode; and
wherein a distributed Bragg reflector (DBR) comprising a dielectric multilayer is disposed between the second semiconductor layer and the connecting electrode, the DBR being configured to reflect light from the semiconductor portion, and the DBR being disposed laterally around the portion of the second electrode that is connected to the second semiconductor layer.

13. The surface emitting laser element according to claim 12, wherein the first and second semiconductor layers are nitride semiconductors.

14. A surface emitting laser element comprising:
a semiconductor portion having a first semiconductor layer and a second semiconductor layer;
a first reflector disposed at the first semiconductor layer side of the semiconductor portion; and
a second reflector disposed at the second semiconductor layer side of the semiconductor portion;
a first electrode connected to the first semiconductor layer;
a second electrode disposed between the second semiconductor layer and the second reflector, a portion of the second electrode being connected to the second semiconductor layer;
a connecting electrode disposed laterally around the second reflector, the connecting electrode being connected to the second electrode; and
a current confinement portion disposed between the second semiconductor layer and the connecting electrode, the current confinement portion being configured to reflect light from the semiconductor portion, and the current confinement potion being disposed laterally around the portion of the second electrode that is connected to the second semiconductor layer, wherein the current confinement portion is a DBR comprising a dielectric multilayer,
wherein the dielectric multilayer of the DBR is made of $SiO_2/Nb_2O_5$, $SiO_2/ZrO_2$, or $SiO_2/AlN$, and
wherein each of the first reflector and second reflector is made of $SiO_2/Nb_2O_5$, $SiO_2/ZrO_2$, or $SiO_2/AlN$.

* * * * *